United States Patent
Rebeiz et al.

(10) Patent No.: US 6,348,830 B1
(45) Date of Patent: Feb. 19, 2002

(54) SUBHARMONIC DOUBLE-BALANCED MIXER

(75) Inventors: Gabriel M. Rebeiz; Kiran Nimmagadda, both of Ann Arbor, MI (US)

(73) Assignee: The Regents of The University of Michigan, Ann Arbor, MI (US)

( * ) Notice: Subject to any disclaimer, the term of this patent is extended or adjusted under 35 U.S.C. 154(b) by 0 days.

(21) Appl. No.: 09/566,584

(22) Filed: May 8, 2000

(51) Int. Cl.$^7$ ................................................. G06G 7/12
(52) U.S. Cl. ....................................... 327/355; 327/359
(58) Field of Search ............................... 327/355, 356, 327/357, 358, 359, 116, 40, 113, 105, 178; 348/659, 660

(56) References Cited

U.S. PATENT DOCUMENTS

| | | | |
|---|---|---|---|
| 3,689,752 A | | 9/1972 | Gilbert ........................ 307/229 |
| 3,710,146 A | | 1/1973 | Ohsawa ....................... 307/271 |
| 3,931,583 A | | 1/1976 | Gilbert ........................ 330/38 |
| 4,075,574 A | | 2/1978 | Gilbert ........................ 330/257 |
| 4,099,228 A | | 7/1978 | Cohn .......................... 363/159 |
| 4,156,283 A | | 5/1979 | Gilbert ........................ 364/841 |
| 4,734,591 A | | 3/1988 | Ichitsubo .................. 307/219.1 |
| 5,517,687 A | | 5/1996 | Niehenke et al. ........... 455/325 |
| 5,530,387 A | | 6/1996 | Kim ............................ 327/119 |
| 5,554,945 A | | 9/1996 | Lee et al. .................... 327/125 |
| 5,630,228 A | * | 5/1997 | Mittel ......................... 327/359 |
| 5,635,866 A | | 6/1997 | Monk et al. ................. 327/116 |
| 5,659,263 A | * | 8/1997 | Dow et al. ................... 327/356 |
| 5,760,622 A | | 6/1998 | Ishigaki ...................... 327/113 |
| 6,073,002 A | * | 6/2000 | Peterson ..................... 327/356 |
| 6,144,846 A | * | 11/2000 | Durec ......................... 327/356 |

OTHER PUBLICATIONS

K. Kimura, et al., Frequency Mixer with a Frequency Doubler for Integrated Circuits, IEEE J. Solid–State Circuits, vol. 29, No. 9, pp 1133–1137, Sep. 19944.

R.G. Meyer, et al., A 2.5–BHz BiCMOS Transceiver for Wierless LANSs, IEEE J. Solid–State Circuits, vol. 32, pp. 2097–2104, Dec. 1997.

L. Sheng, et al., A Si/SiGe HBT Sub–Harmonic Mixer/Downconverter, IEEE BCTM proceedings, pp. 71–74, Sep. 1999.

B. Gilbert, The Multi–tanh Principle: A Tutorial Overview, IEEE J. Solid–State Circuits, vol. 33, No. 1, pp. 2–17, Jan. 1998.

Isuneo Tsukahara, Et Al., WP 23.5 3 to 5GHz Quadrature Modulator and Demodulator Using A Wideband Frequency–Doubling Phasse Shifter, 2000 IEEE International Solid–State Circuits Conference, pp 384–385 & 471.

* cited by examiner

Primary Examiner—Timothy P. Callahan
Assistant Examiner—Linh Nguyen
(74) Attorney, Agent, or Firm—Brooks & Kushman P.C.

(57) ABSTRACT

A subharmonic double-balanced mixer (SDBM) combines a first signal having an RF frequency and a plurality of LO drive signals each having a frequency approximately one-half the RF frequency to obtain an output signal having an intermediate frequency. The intermediate frequency can be the baseband signal in direct conversion receivers. Two embodiments of the current invention using a two-level transistor circuit are described. In one of the embodiments, the RF section is in the bottom level transistors and in the other, the LO section is in the bottom level transistors. The device occupies a substantially reduced area on a semiconductor chip when compared with prior art devices.

23 Claims, 7 Drawing Sheets

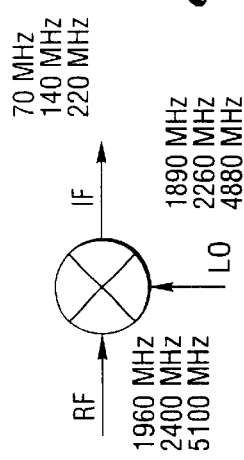
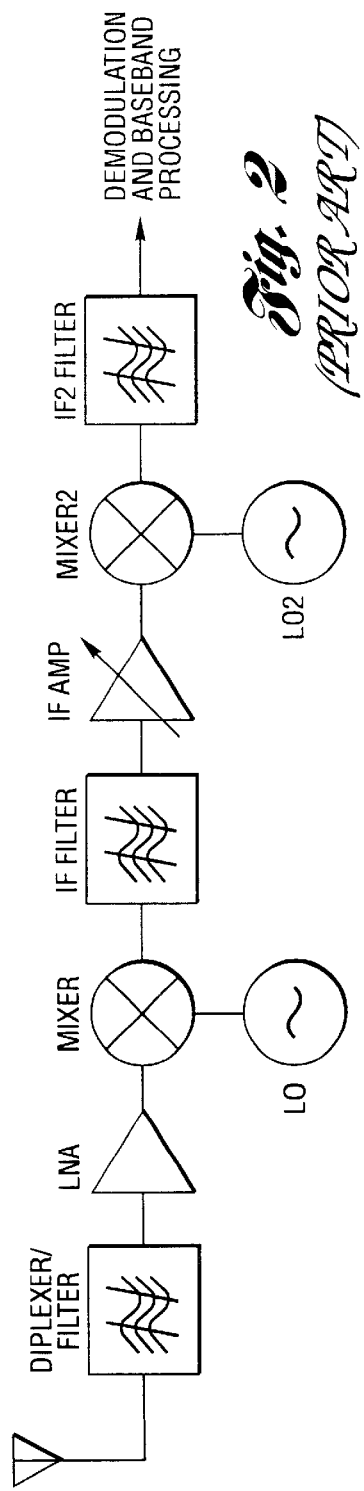
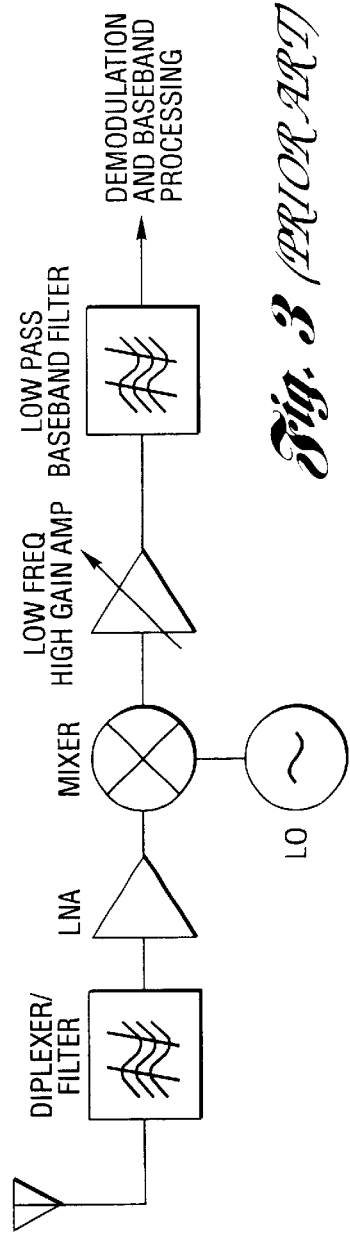

SUBHARMONIC DOUBLE-BALANCED MIXER

GOVERNMENT RIGHTS

This invention was made with government support under Contract No. ECS-9158499 awarded by NSF and Grant No. DAAH04-96-1-0001 awarded by USARO. The government has rights in the invention.

TECHNICAL FIELD

This invention relates to subharmonic double-balanced mixers and, in particular, to subharmonic double-balanced mixers which can be implemented by integrated circuit techniques.

BACKGROUND ART

There is currently a great amount of activity in realizing low cost Si based transceivers for the wireless communications market. All transceiver architectures use a mixer for the frequency translation from the RF (radio frequency) to the IF (intermediate frequency) and vice versa. A double-balanced Gilbert cell mixer is routinely used in most transceivers today where high LO (local oscillator) to RF isolation and high LO/RF suppression at the IF port is needed.

A mixer is a nonlinear device containing either diodes or transistors, the function of which is to combine signals of two different frequencies in such a way as to produce energy at other frequencies. The mixer is typically built using Silicon, GaAs, or InP diodes, or using Silicon-based transistor technology comprising but not limited to, BJT (bipolar Junction Transistors), MOS and CMOS transistors, BiCOMS (bipolar/CMOS), or using SiGe-based transistors (HBT, etc.), or using GaAs-based transistor technology (MESFET, HEMT, HBT, etc.) or using InP-based transistors technology (MESFET, HEMT, etc.).

In a typical down converter application within a heterodyne receiver, a mixer has two inputs and one output. One of the inputs is the modulated carrier RF or microwave signal at a frequency $f_{RF}$, the other is a well controlled signal from a local oscillator at a fixed frequency, or a voltage controlled oscillator (VCO), at a frequency $f_{LO}$. The result of down conversion is a signal at the difference frequency $f_{RF}-f_{LO}$ or $f_{LO}-f_{RF}$, which is also called the intermediate frequency $f_{IF}$. A filter is sometimes connected to the output of the mixer to allow only the desired IF frequency signal to be passed on for further processing. For example, for an RF frequency of 840 MHz and an LO frequency of 770 MHz, the IF frequency would be 70 MHz. Another example is an RF frequency of 1960 MHz and an LO frequency of 1820 MHz, resulting in an IF frequency of 140 MHz at the output of the mixer. FIG. 1 illustrates several other frequency selections for the RF, LO and IF signals.

The mixer circuit is also commonly used as an up converter. In this case, the low frequency (baseband or intermediate frequency) modulated signal is upconverted in the mixer using a local oscillator (fixed frequency or voltage controlled oscillator) to generate the modulated RF or microwave signal. The resulting signal of the up-conversion is at a frequency given by $f_{LO}+f_{IF}$, or $f_{LO}-f_{IF}$. A filter is sometimes used at the output of the up converter (mixer) to choose either one of these frequencies. In general, all the properties such as isolation between the IF, RF and LO ports, intermodulation, conversion loss, etc. of the up converter are closely related, if not identical, to the properties of the down converter mixer.

There are several kinds of receiver topologies which are commonly used today. The first one is commonly called the heterodyne receiver (or the superheterodyne receiver) which uses an intermediate frequency which is rather high, as is illustrated in FIG. 2. The IF signal can be selected to be anywhere, at 10 MHz, 40 MHz, 140 MHz, 220 MHz, 400 MHz, etc. and even 1 or 2 GHz in high frequency systems (RF of 5–20 GHz). The IF signal is filtered, amplified in a high gain IF amplifier chain, and then down converted again to a low frequency (typically called the second IF) for demodulation and detection.

The other receiver topology is called a direct conversion receiver which uses virtually no IF signals, and down converts the RF signal directly into baseband, as illustrated in FIG. 3. In this case, for an RF signal with a center frequency of 1960 MHz and a bandwidth of 1 MHz, one would choose an LO at 1960 MHz, resulting in an IF signal output of 0–1 MHz. The direct conversion receiver results in a much easier system layout, and also saves on using expensive IF filters, and the resulting IF electronics. The bandwidth of the baseband signal is typically given by the type of modulation used, and can be 0–200 KHz, 0–1 MHz, or even 0–5 MHz. There are also other kinds of receivers, such as the low-IF heterodyne receiver, which are less commonly used.

The direct conversion topology is much less expensive to build than the standard heterodyne receiver with its IF electronics, and will miniaturize the front-end electronics even further than today's state-of-the-art. It is expected to be used in the new wireless local loop transceivers at 2.4 GHz, 3.5 GHz, 4.9 GHz, 5.8 GHz, etc., in low-cost cordless telephones at 900–1100 MHz, and in the new digital cellular telephones (1700–2100 MHz).

One must be very careful in mixer designs to ensure that no LO power and no RF power leak into the IF port. The reason is that the IF port is typically followed by a high gain amplifier and any LO leakage can saturate this IF amplifier. Also, any RF or LO leakage can introduce intermodulation products in the IF amplifier and limit the sensitivity of the receiver. This is typically done using a filter at the IF port which is selected to pass the IF signal, and to greatly attenuate the RF and LO signals. This embodiment is common in single and balanced mixer designs, but the filter occupies a lot of space on the RF integrated circuit. In reality, and for RFIC applications, single and balanced mixer designs are rarely used because of the existence of the Gilbert-Cell double-balanced mixer as described hereinbelow. However, balanced mixers built with an integral IF filter are typically used at microwave frequencies (5 GHz, 10 GHz, etc.) since they offer acceptable performance without taking a lot of space on the MMIC wafer.

The double-balanced mixer topology results in no RF and LO leakage at the IF port, and therefore no IF filter is used with this topology. The "double-balanced mixer" is the most commonly used topology in integrated circuit mixers. A double-balanced mixer is essential in RF-IC mixers since it mitigates the use of complicated and expensive on-chip (or off-chip) filters to remove the LO and RF signals at the output IF port. Double-balanced mixers are typically built using a "Gilbert-Cell" topology in RFIC transistor circuits, as is illustrated in FIG. 4, or using a transformer-coupled diode-ring circuit. In RFIC applications which use a Gilbert-Cell topology, the double-balanced mixer requires that the LO and the RF frequencies be relatively close to each other (RF at 1960 MHz, LO at 1820 MHz and with an IF of 140 MHz).

A subharmonic double-balanced mixer has the same function as a regular double-balanced mixer, and still offers high isolation between the RF and IF ports, LO and IF ports and RF and LO ports, but uses an LO frequency which is approximately half that of the RF signal, as illustrated in FIG. 5. The IF signal frequency is therefore the difference frequency between RF signal frequency and 2 times the LO signal frequency ($f_{IF}=f_{RF}-2f_{LO}$, or $f_{IF}=2f_{LO}-f_{IF}$). In the case of heterodyne architectures with an RF signal at 1900 MHz (or 2400 MHz), rather than use an 1830 MHz LO (or a 2330 MHz LO), one could use a 915 MHz LO (or a 1165 MHz LO) to achieve an IF of 70 MHz. The use of a lower frequency local oscillator frequency simplifies the LO design, and most importantly, since the LO is at a lower frequency, one can integrate the LO on the RFIC chip and still satisfy the system phase-noise requirements. One can immediately see the need of this mixer for the new PCS bands and wireless local loop bands at 1900 MHz and 2400 MHz.

The subharmonic double-balanced mixer is also very beneficial to dual-band cellular telephones since only one LO signal is needed to cover both the 800 MHz band and the 1900 MHz band, and an example of such a system is illustrated in FIG. 6. This will save the designer a lot of space and cost in the RF front-end, will greatly simplify the system architectures, and will eliminate the cross-talk problems commonly available in dual-band systems which use two different LO frequencies.

The direct conversion topology mitigates the use of IF processing thereby resulting in a low cost receiver. However, direct conversion transceivers employing the standard double-balanced mixer have suffered from a serious technical problem, which is the feedthrough (leakage) of the LO signal to the RF port, its reflection back into the standard double-balanced mixer, its eventual self-mixing in the standard double-balanced mixer and the generation of a random DC offset at the output IF port. There are several leakage paths between the LO source and the RF port, some of which are shown in FIG. 7. This random DC offset signal is added to the IF signal, and can saturate the high-gain IF (baseband) amplifiers thereby limiting the receiver sensitivity. To date, there has not been a good solution to the LO self-mixing problem using double-balanced mixers.

The subharmonic double-balanced mixer further offers an excellent solution to the LO self-mixing problem as illustrated in FIG. 8. The reason is that if any LO leaks to the RF port and reflects back into the new double-balanced subharmonic mixer, it will mix with $2f_{LO}$ and therefore will not generate any DC offset problems. To continue the example given above for the direct conversion receiver, for an RF signal of 1960 MHz with a bandwidth of 1 MHz, the LO is at half the RF frequency (flo=980 MHz), and the self-mixing of the leakage LO signal in the subharmonic double-balanced mixer generates a signal at the IF port which is again at the LO frequency (fif=f2lo–flo=960 MHz). This output signal frequency is very far away from the required down converted IF (baseband) signal which is at 0–1 MHz, and can be easily filtered out using an on-chip capacitor, and therefore, does not saturate the high-gain baseband amplifiers.

The subharmonic double-balanced mixer also offers the key solution to the problem of LO self-mixing in direct conversion receivers and allows the construction of high performance direct conversion receivers using low cost RFIC techniques. It is very important that a subharmonic double-balanced mixer is used, and not just a subharmonic balanced mixer. The reason is that a subharmonic double-balanced mixer offers high isolation between all three ports (RF, LO and IF) without any external filters, and eliminates the problem of LO self-mixing.

The same concept for the subharmonic mixer operates also on the subharmonic double-balanced up-converter. In this case, the subharmonic double-balanced up converter will translate a modulated IF or baseband signal using a local oscillator signal to result in a modulated RF or microwave signal, with high isolation between the IF, LO and RF ports, and without resulting in any DC output at the RF port due to the LO self-mixing problem.

There have been few implementations of subharmonic mixers to date. The easiest implementation is to first double the LO frequency using a frequency "doubler", and then use the doubled LO frequency in a standard double-balanced mixer. This circuit was first used by Kimura et al., published in 1994 (Ref 2) and then by Meyer et al., published in 1997 (Ref 3). While this circuit may be applicable to low cost heterodyne receivers with non-stringent intermodulation requirements, it still does not solve the LO self mixing problem since the doubled LO signal can still leak to the antenna or the RF port and mix with itself in the standard double-balanced mixer, as illustrated in FIG. 9.

Another implementation was presented by Sheng et al., published in 1999 (Ref 4). In this case, the LO is divided into four signals, each 90 degrees in phase from each other (LO signals are at 0°, 90°, 180° and 270°) and these signals are fed to a three-level transistor Gilbert-cell type mixer, as illustrated in FIG. 10. This embodiment of the subharmonic double-balanced mixer results in a three-level transistor circuit and therefore requires a higher supply voltage than Gilbert cell mixers which are commonly built using a two-level transistor circuit.

The references cited in this application are more fully identified as follows:
1. B. Gilbert, "Four-Quadrant Multiplier Circuit". U.S. Pat. No. 3,689,752;
2. K. Kimura and H. Asazawa, "Frequency Mixer with a Frequency Doubler for Integrated Circuits", IEEE J. SOLID-STATE CIRCUITS, Vol. 29, No. 9, pp. 1133–1137, September 1994;
3. R. G. Meyer, W. D. Mack and J. J. E. M. Hageraats, "A 2.5-GHz BiCMOS Transceiver for Wireless LANs", IEEE J. SOLID-STATE CIRCUITS, Vol. 32, pp.2097–2104, December 1997;
4. L. Sheng, J. Jensen, L. Larson, "A Si/SiGe HBT Sub-Harmonic Mixer/Downconverter", IEEE BCTM proceedings, pp. 71–74, September 1999; and
5. B. Gilbert. "The Multi-tanh Principle: A Tutorial Overview", IEEE J. SOLID-STATE CIRCUITS, Vol. 33, No. 1, pp. 2–17, January 1998.

DISCLOSURE OF INVENTION

An object of the present invention is to provide a subharmonic double-balanced mixer which does not consume a significant amount of power and which works on standard, low voltage batteries. A two-level transistor circuit is preferably utilized in the mixer to yield a high performance. The mixer operates at very low voltages (around 2–2.7 V) and consumes a low amount of power.

Another object of the present invention is to provide a low cost subharmonic double-balanced mixer which is very small and which are compatible with Si, GaAs and InP RFICs and MMICs for wireless communication systems.

Yet another object of the present invention is to provide a subharmonic double-balanced mixer which has wide RF bandwidth (more than 100 MHz at 1900 MHz input) and a high rejection of both the LO and the RF power at the IF port.

Yet another object of the present invention is to provide a subharmonic double-balanced mixer which can solve the problem of LO self-mixing in direct conversion receivers.

In carrying out the above objects and other objects of the present invention, a non-linear device for combining a first signal having a first frequency and first, second, third and fourth drive signals each having a second frequency approximately one-half the first frequency to obtain an output signal having a third frequency is provided. The device includes a first circuit section which has an input port to receive the first signal. The first signal can either be single-ended or differential. The device also includes a second circuit section having first, second, third and fourth drive ports adapted to receive the first, second, third and fourth drive signals, respectively. The second drive signal is approximately 180° out of phase with respect to the first drive signal and the fourth drive signal is approximately 180° out of phase with respect to the third drive signal. The first drive signal is approximately 90° out of phase with respect to the third drive signal and the second drive signal is approximately 90° out of phase with respect to the fourth drive signal. In other words, the first and second drive signals form a first differential signal, the third and fourth drive signals form a second differential signal, and the first and second differential signals are driven in quadrature or are approximately 90° out of phase with respect to each other. The first circuit section and the second circuit section are connected together to generate the output signal at the third frequency which depends on the first signal at the first frequency and the first, second, third and fourth drive signals at the second frequency.

The first signal is preferably an RF signal and the first circuit section is preferably an RF circuit section. The first, second, third and fourth drive signals are preferably LO signals driven at the phases mentioned above and the second circuit section is preferably an LO circuit section. The third frequency is either a sum of or a difference between the first and twice the second frequency depending on whether the device is used in upconversion or downconversion.

In one embodiment of the invention, the second circuit section includes first and second circuits. The first circuit is driven in a quadrature manner relative to the second circuit by the first and second drive signals, and the third and fourth drive signals, respectively. The first circuit includes a first pair of interconnected transistors which are driven by the first and second drive signals in a differential manner to generate a first current signal switching at twice the second frequency. The second circuit includes a second pair of interconnected transistors which are driven by the third and fourth drive signals in a differential manner to generate a second current signal which has a phase difference of approximately 180° from the first current signal and is also switching at twice the second frequency. The first circuit section is connected to the second circuit section and includes the input port to receive the first signal at the first frequency and the output port to obtain the output signal at the third frequency. The double-balanced mixing between the first signal at the first frequency and the first and the second current signals at the twice the second frequency in the first circuit section generates the output signal at the third frequency which is a difference between (or a sum of) the first frequency and twice the second frequency when the circuit is used as a downconversion (or an upconversion) mixer, respectively.

In another embodiment of the invention, the second circuit section includes first and second pairs of circuits. The first pair of circuits are driven in a quadrature manner relative to the second pair of circuits by the first and second drive signals and the third and fourth drive signals, respectively. Each of the first pair of circuits includes a pair of interconnected transistors which are driven by the first and second drive signals in a differential manner. Each of the second pair of circuits includes a pair of interconnected transistors which are driven by the third and fourth drive signals in a differential manner. The first circuit section is connected to the second circuit section and includes the input port to receive the first signal at the first frequency. The first circuit section generates first and second current signals at the first frequency. The double-balanced mixing between the first and second current signals at the first frequency and twice the second frequency occurs in the second circuit section due to interconnections of the transistors in the second circuit section and generates the output signal at the third frequency which is a difference between (or a sum of) the first frequency and twice the second frequency when the circuit is used as a downconversion (or upconversion) mixer.

The above objects and other objects, features, and advantages of the present invention are readily apparent from the following detailed description of the best mode for carrying out the invention when taken in connection with the accompanying drawings.

BRIEF DESCRIPTION OF DRAWINGS

FIG. 1 is a schematic diagram which illustrates examples of the frequencies of operation of RFIC mixers;

FIG. 2 is a schematic diagram of a typical heterodyne receiver;

FIG. 3 is a schematic diagram of a typical direct downconversion receiver;

DETAILED DESCRIPTION OF THE INVENTION

Figure 4:
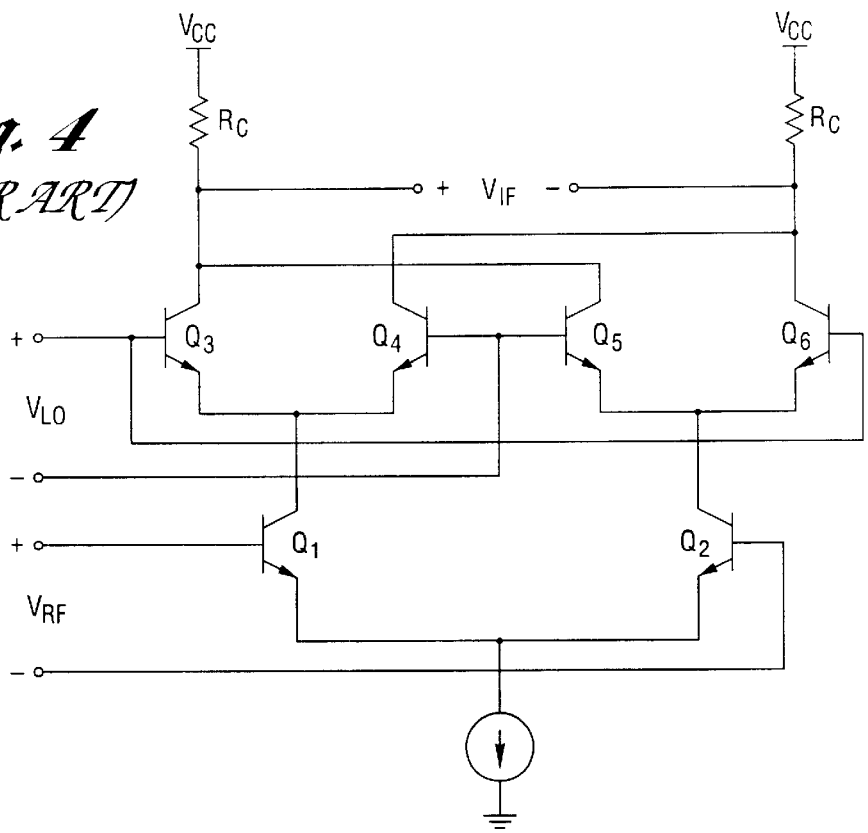
FIG. 4 is a simplified schematic diagram of a Gilbert cell mixer.
Figure 5:
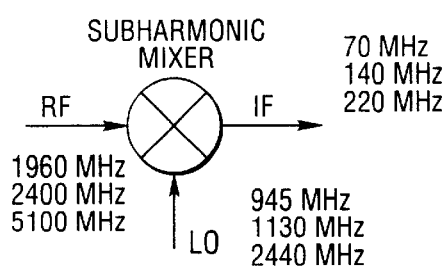
FIG. 5 is a schematic diagram which illustrates examples of frequencies of operation of RFIC Subharmonic mixers.
Figure 6:
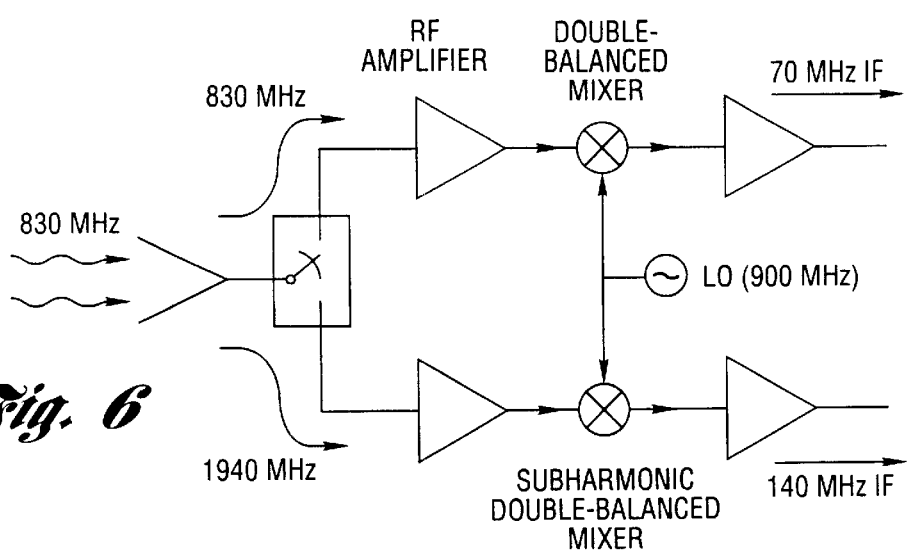
FIG. 6 is a schematic diagram showing the use of subharmonic mixers in dual band receivers which employ a single LO source.
Figure 7:
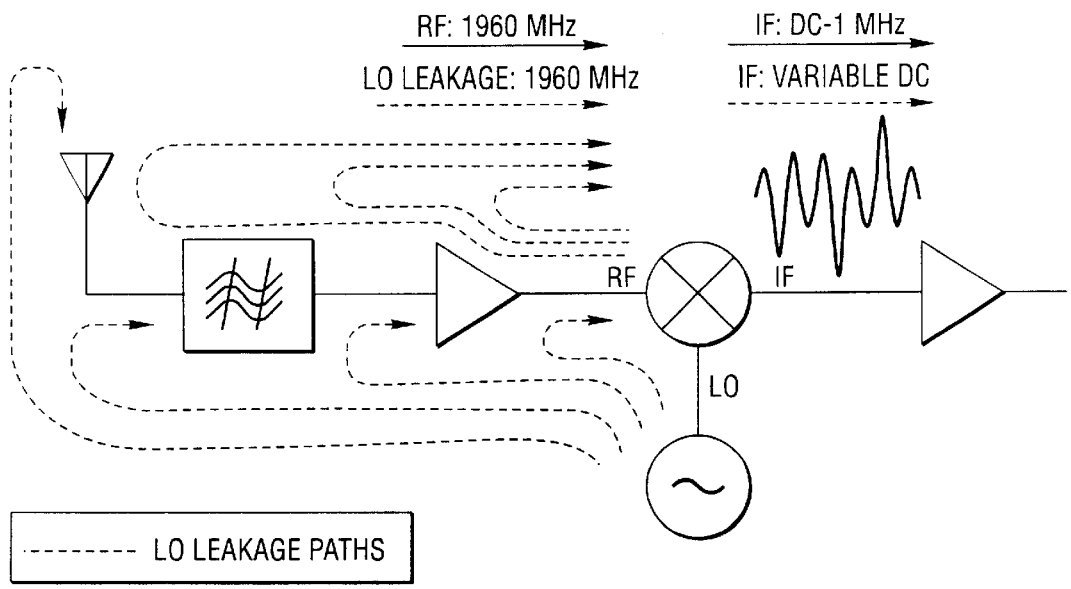
FIG. 7 is a schematic diagram which shows the leakage paths of the LO signal in typical RFIC double-balanced mixers resulting in a variable DC output at the IF port.
Figure 8:
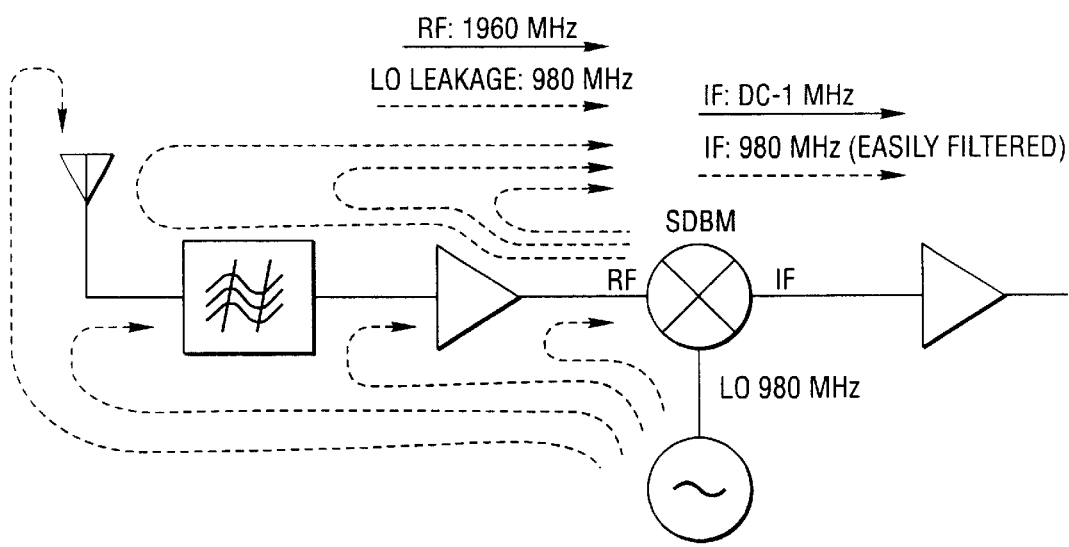
FIG. 8 is a schematic diagram which shows the leakage paths of the LO signal in RFIC subharmonic double-balanced mixers.
Figure 9:
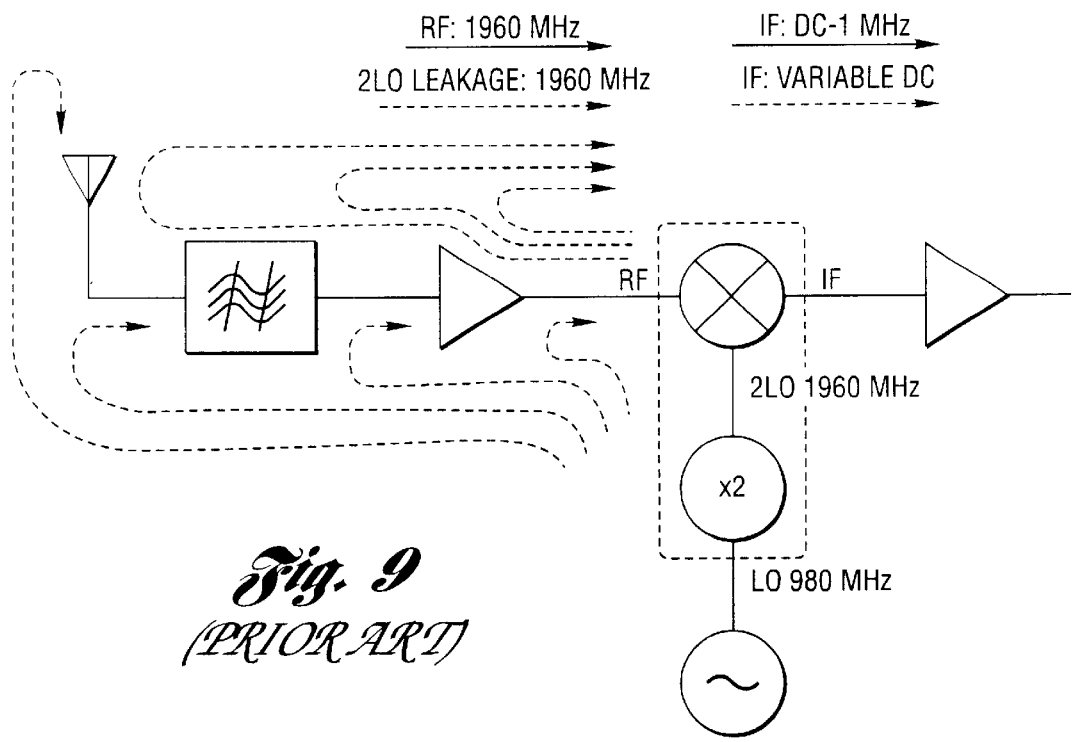
FIG. 9 is a schematic diagram which shows the leakage of 2LO signal in prior art RFIC subharmonic double-balanced mixers.
Figure 10:
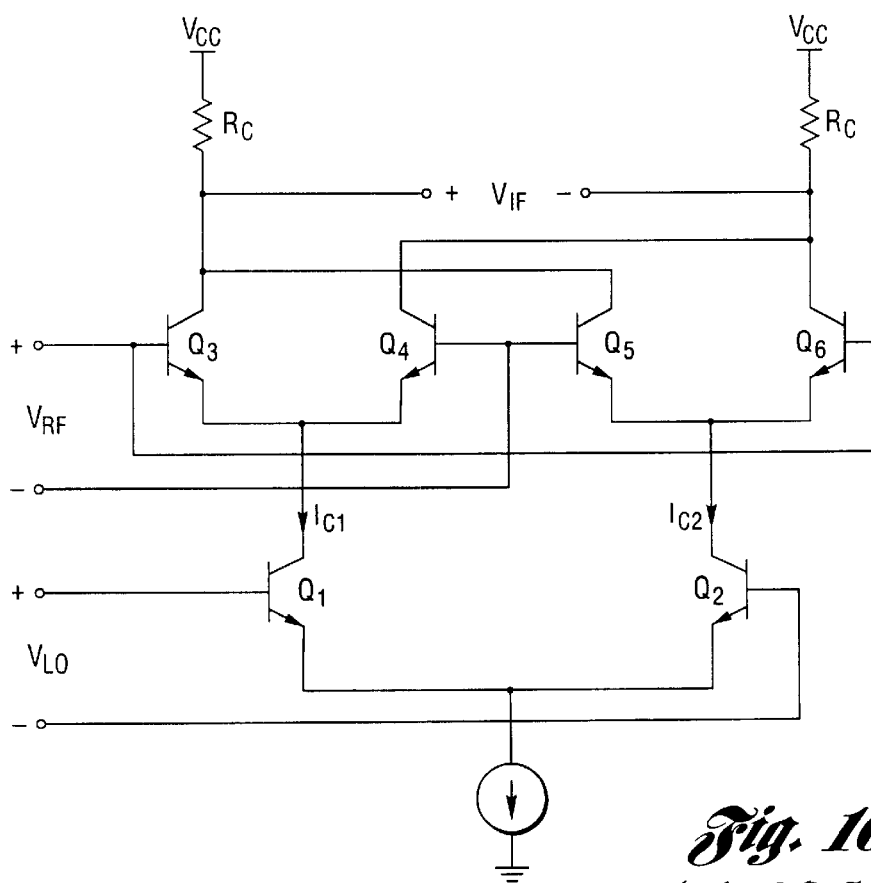
FIG. 10 is a simplified schematic diagram of a Gilbert cell double-balanced mixer with the RF and LO ports interchanged.

FIG. 10 is a simplified schematic of the Gilbert cell mixer which is routinely used in most RFIC applications requiring a double-balanced mixer. In the schematic shown, the RF and LO sections are interchanged when compared to a typical implementation of the Gilbert cell mixer illustrated in FIG. 4. Both of the implementations of FIGS. 4 and 10 result in double-balanced mixing operation. The implementation of FIG. 10 is shown so as to compare and illustrate the operation of one embodiment of the present invention. In this circuit, transistors Q1 and Q2 form a differential pair that accept the LO signal as the input. Thus currents $I_{c1}$ and $I_{C2}$ generated in the LO section as shown in FIG. 4 are 180° out of phase and switch at the rate of the LO frequency. These currents are fed into the RF section and the double-balanced mixing happens in the RF section transistor quad (Q3,Q4,Q5,Q6). It should be noted that the double-balanced mixing operation results from the 180° phase difference between the two LO currents, $I_{C1}$ and $I_{C2}$, being fed to the RF section transistors.

Figure 11:
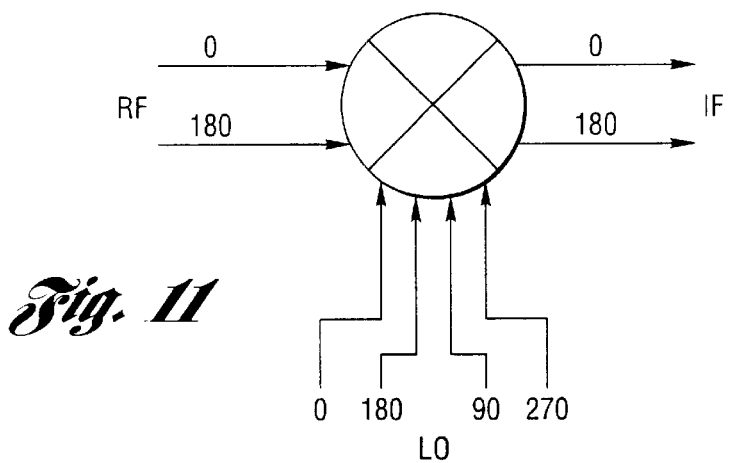
FIG. 11 is a conceptual block diagram of a subharmonic double-balanced mixer constructed in accordance with the present invention.
Figure 12:
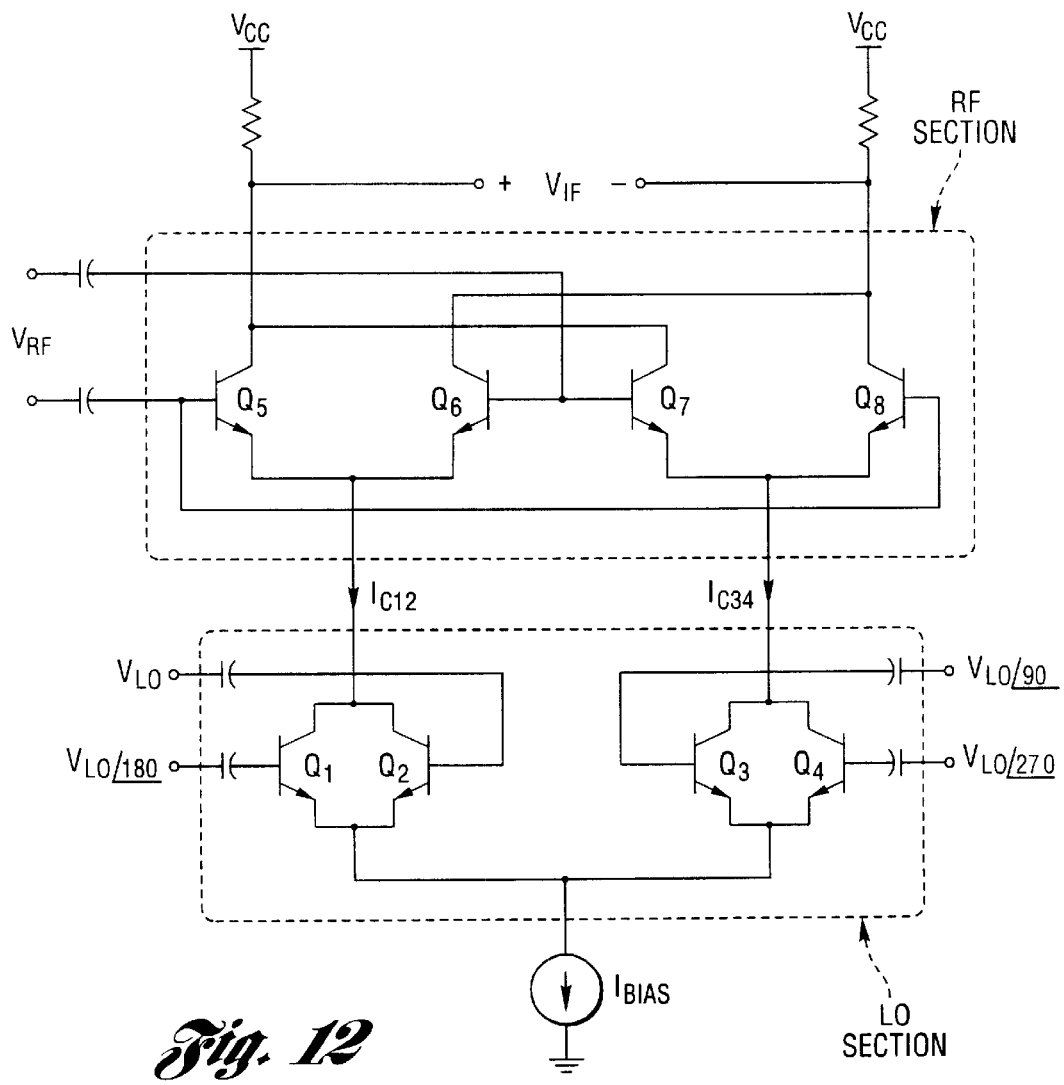
FIG. 12 is a simplified schematic diagram of a first embodiment of the subharmonic double-balanced mixer of the invention.

FIG. 11 shows a conceptual drawing of the subharmonic double-balanced mixer of the present invention with four LO drives. FIG. 12 shows a simplified schematic of the first embodiment of the subharmonic double-balanced mixer of the present invention. For simplicity, biasing details are not shown in FIG. 12. The LO section consists of transistors Q1, Q2, Q3 and Q4. The bases of the transistors Q1 and Q2 are coupled to the first LO differential signal formed by the first and second LO drive signals (0°–180°). The bases of the transistors Q3 and Q4 are coupled to the second LO differential signal formed by the third and fourth LO drive signals (90°–270°). The second LO differential signal is 90° out of phase with the first LO differential signal. The emitters of Q1, Q2, Q3 and Q4 are connected together to a biasing current source, $I_{bias}$. The collectors of Q1 and Q2 are connected together to form a doubling pair. The sum of the collector currents of Q1 and Q2, denoted as $I_{C12}$ as shown in FIG. 12 depends on the LO differential signal and has a frequency twice that of the LO signal.

Similarly, the collectors of Q3 and Q4 are connected together and the sum of the currents through their collectors is denoted by $I_{C34}$ and has a frequency twice that of the LO signal. Due to the 90° phase shift between the two differential LO signals driving the transistor pairs Q1/Q2 and Q3/Q4, and since the currents $I_{C12}$ and $I_{C34}$ have twice the LO frequency, the phase difference between $I_{C34}$ and $I_{C12}$ is 180°.

Figure 13:
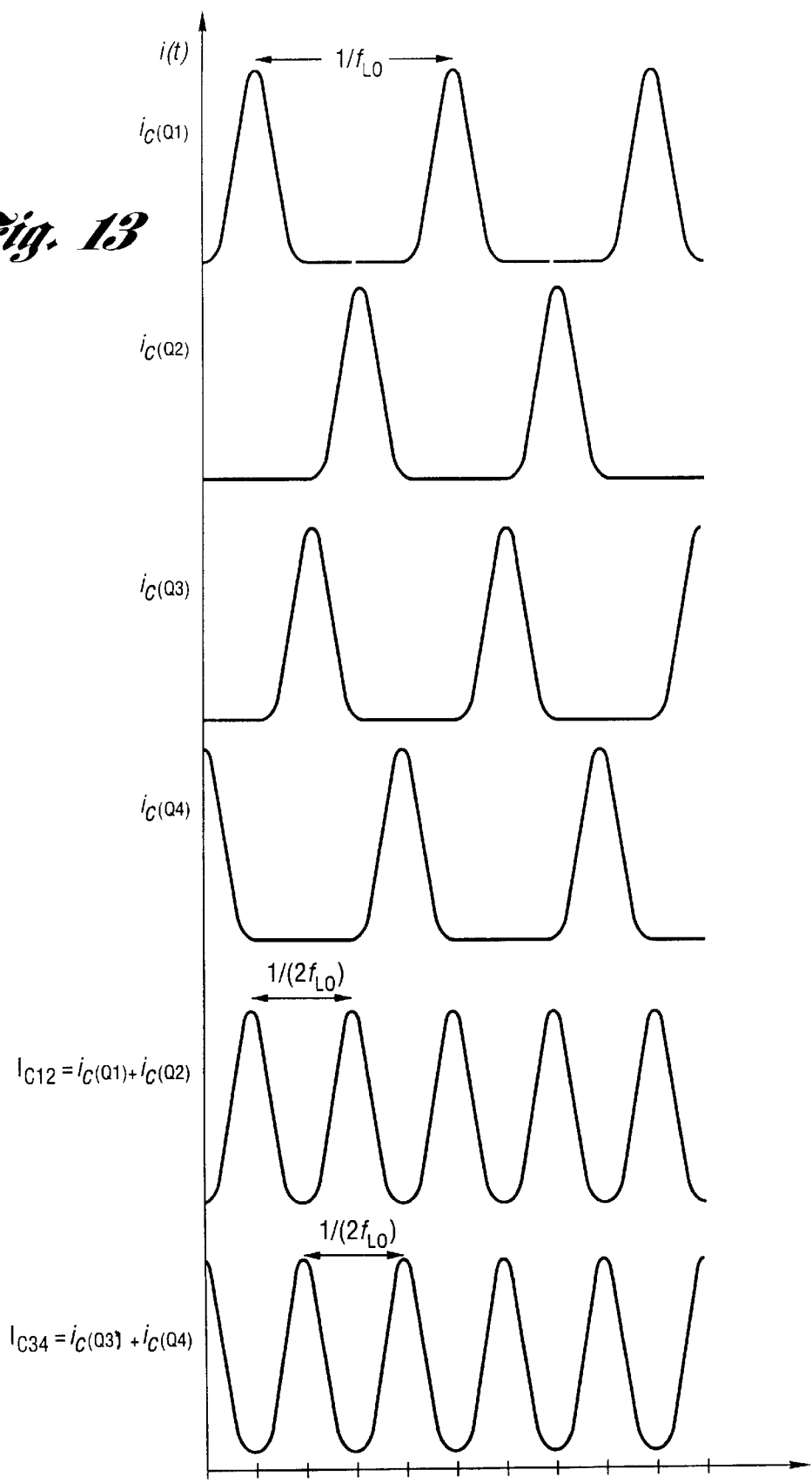
FIG. 13 illustrates a number of graphs which show the frequency doubling operation in the collector currents of the schematic diagram of FIG. 12.

FIG. 13 shows the collector currents of Q1 through Q4 and the frequency doubling action and the 180° phase difference in the currents $I_{C12}$ and $I_{C34}$.

Referring again to FIG. 12, the RF section consists of transistors Q5,Q6,Q7 and Q8 which form the mixing core of the mixer. The bases of transistors Q5 and Q8 are connected together, and the bases of transistors Q6 and Q7 are connected together. The differential RF signal is coupled to the bases of Q5/Q8 and Q6/Q7. The collectors of Q5 and Q7 are connected together, and the collectors of Q6 and Q8 are connected together. The two collector connections are then connected to the loads, which are shown to be resistive in FIG. 12. However, the loads can be inductive for lower voltage headroom or can be configured as transistor loads, commonly called active loads. The other end of the loads are connected to the power supply voltage. The differential IF signal is taken out from the two loads as shown in FIG. 12.

The emitters of Q5 and Q6 are connected together and are connected to the collectors of Q1 and Q2. The emitters of Q7 and Q8 are connected together and are connected to the collectors of Q3 and Q4. The currents $I_{C12}$ and $I_{C34}$, which are at twice the LO frequency, are fed into the RF section through the emitter connections of Q5/Q6 and Q7/Q8. The mixing between the RF frequency and twice the LO frequency occurs in the RF section in the current domain, thus achieving subharmonic, double-balanced mixing.

Figure 14:
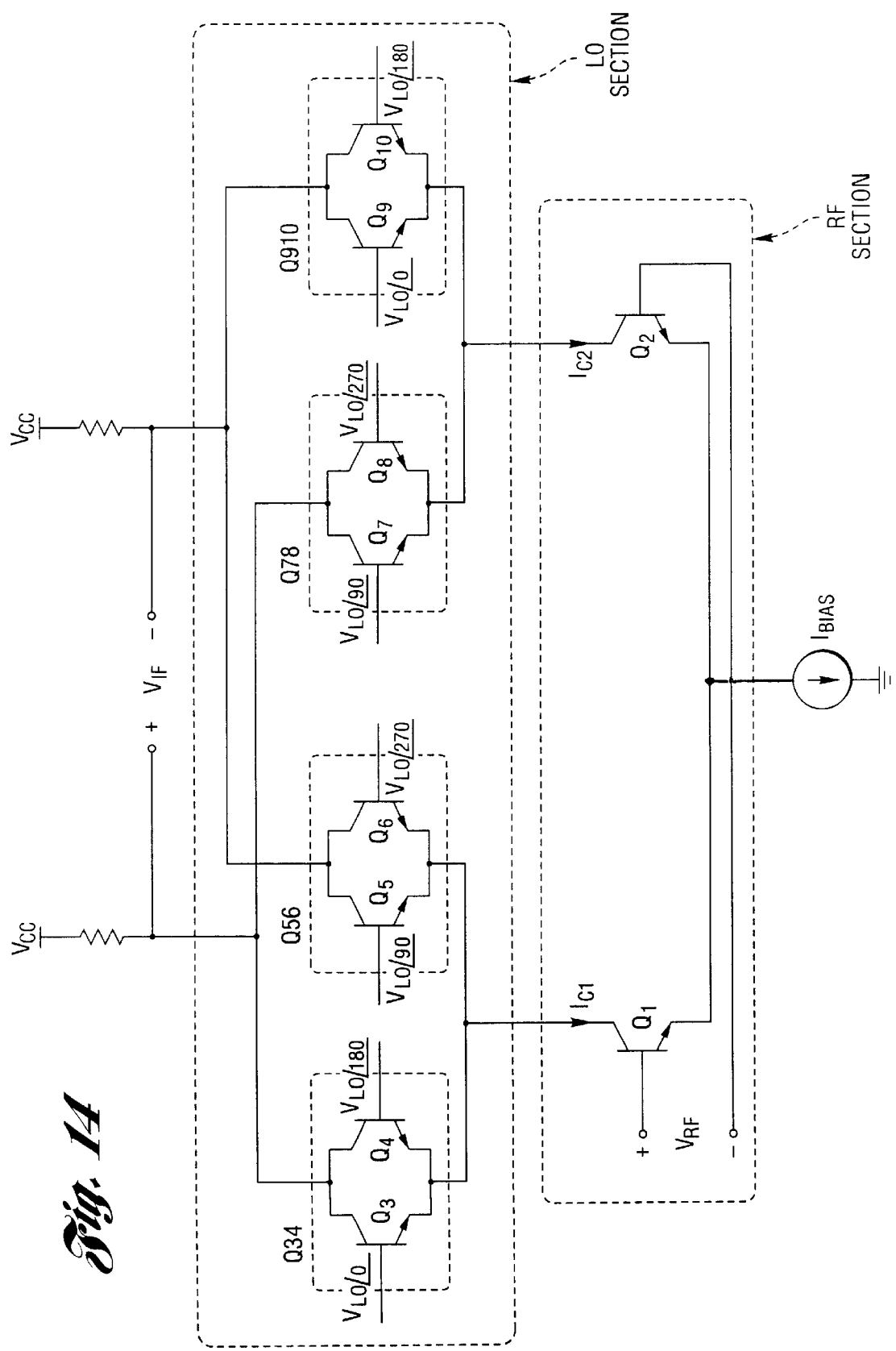
FIG. 14 is a simplified schematic diagram of a second embodiment of the subharmonic double-balanced mixer of the invention.

FIG. 14 shows a simplified schematic of a second embodiment of the proposed subharmonic, double-balanced mixer of the present invention. Transistors Q1 and Q2 form a simple differential pair and form the RF section. The differential RF signal is coupled to the bases of Q1 and Q2. The emitters of Q1 and Q2 are connected together to the biasing current source, $I_{bias}$. The collector currents, $I_{C1}$ and $I_{C2}$, illustrated in FIG. 14 are 180° out of phase and switch at the rate of the RF frequency. Transistors Q3–Q10 form the LO section. Each of the transistor pairs Q3/Q4, Q5/Q6, Q7/Q8 and Q9/Q10 (denoted as Q34, Q56, Q78 and Q910) functions as a frequency doubler. The bases of each transistor pair, Q34, Q56, Q78 and Q910, receive a differential LO input signal and the collectors and emitters of each transistor pair are tied together. The four transistor pairs are connected to form a switching core, usually called a quad, which is similar to the quad in the classic Gilbert cell mixer shown in FIG. 4.

The pairs Q34 and Q910 both receive the first differential LO signal (0°–180°) and the pairs Q56 and Q78 receive the second differential LO signal (90°–270°) which is 90° out of phase from the first. The collectors of Q34 and Q78 are connected together to a load and so are the collectors of Q56 and Q910. The differential IF signal is taken out from the two loads as illustrated in FIG. 14. The emitters of the transistor pairs Q34 and Q56 are connected together to the collector of Q1, and the emitters of the transistor pairs Q78 and Q910 are connected together to the collector of Q2. The currents $I_{C1}$ and $I_{C2}$ switching at the RF frequency are fed into the LO section made up of the frequency doublers (Q34, Q56, Q78, Q910) and the mixing between the RF frequency and twice the LO frequency occurs in the LO section in the current domain.

There are a number of ways the four phase LO drive can be generated for both embodiments of the subharmonic mixer. For example, an RC differential polyphase filter can be used to generate two differential LO drives 90° out of phase from each other. Or, the four phase drive can be obtained by tapping different nodes of a ring oscillator, or the four phases can be generated using a direct digital frequency synthesizer. This invention does not depend on how the four phase LO drive is generated.

The phase of the LO drives may be different. This means that instead of driving it with 0°–180° degrees and 90°–270° degrees, one could drive it with 45°–225° degrees and 135°–315° degrees, or any constant phase shift at the four different LO inputs, as long as the quadrature phase relation between the two differential pairs of the LO drives is maintained.

Also, the mixer performance is not sensitive to the exactness of the LO drive. That is, even if the LO signal has a few degrees of error in any of the four LO signal drives, the performance of the circuit is still very good. This is important since this means that the double-balanced subharmonic mixer performance can be obtained over a relatively wide frequency range (100's of MHz) which is enough to cover a whole cellular band.

Emitter degeneration resistors, or emitter degeneration inductors employed to avoid noise penalty, can be used for linearization and better input matching in the RF section of both the embodiments of the subharmonic double-balanced mixer. However, in the first embodiment, using a degeneration beyond a certain amount for linearization degrades the nonlinear mixing action occuring in the RF section. The RF section can also be linearized using the multi-tanh transistor principle, published by Gilbert in 1998 (Ref 5).

The bias current $I_{bias}$ in both of the embodiments of the subharmonic double-balanced mixer can be generated in a number of ways depending on the technology of implementation of the circuit (Si-MOS, Si-CMOS, Si-BJT, SiGe-HBT, GaAs-FET, etc.). For example, in bipolar transistor technology, it is fairly common to use a PTAT (proportional to absolute temperature) bias current so that the input impedance of the RF section remains invariant over a wide temperature range. Low cost implementations may use a simple resistor to do the function of the current source, $I_{bias}$.

The subharmonic double-balanced mixer does not consume a lot of power and can be designed to work at 2.0–2.7 V which is compatible with today's batteries. The subharmonic double-balanced mixer has low distortion, good conversion loss, low noise, wide bandwidth and, most importantly, it has a very high rejection of both the LO and the RF power at the IF port. The novel double-balanced subharmonic mixer is very small, and are compatible with RFIC technology, and can be constructed using Si-MOS, Si-CMOS, Si-BJT, SiGe, GaAs and InP transistors, or other technologies with 3-terminal transistor-like characteristics.

Applications

Three main applications of the double-balanced subharmonic mixer circuit of the present invention are 1) its use in direct conversion receiver for the mitigation of the LO self-mixing problem, 2) its use in dual-band radios and cellular telephones, and 3) its use in the new wireless transceivers operating at 1.9 GHz, 2.4 GHz, 3.5 GHz, 4.9 GHz, etc.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention.

What is claimed is:

1. A non-linear device for combining a first signal having a first frequency and first, second, third and fourth drive signals each having a second frequency approxinately one-half the first frequency to obtain an output signal having a third frequency, the device comprising:

a first circuit section having an input port to receive the first signal wherein the first signal can either be a single-ended or a differential signal; and a second circuit section having first, second, third and fourth drive ports adapted to receive the first, second, third and fourth drive signals, respectively, wherein the second drive signal is approximately 180° out of phase with respect to the first drive signal, and a fourth drive signal is approximately 180° out of phase with respect to the third drive signal;

the first drive signal is approximately 90° out of phase with respect to the third drive signal and the second drive signal is approximately 90° out of phase with respect to the fourth drive signal;

wherein the first and second drive signals form a first differential signal and the third and fourth drive signals form a second differential signal, the first and second differential signals being driven in quadrature or are approximately 90° out of phase with respect to each other;

the first circuit section and the second circuit section are connected together to generate first and second current signals approximately 180° out of phase with respect to each other and each having a frequency approximately twice the second frequency and equal to the first frequency and to generate the output signal at the third frequency which is based on the first signal at the first frequency and the first, second, third and fourth drive signals at the second frequency.

2. The device as claimed in claim 1 wherein the first signal is an RF signal and the first circuit section is an RF section.

3. The device as claimed in claim 2 wherein the first, second, third and fourth drive signals are LO signals and the second circuit section is an LO section.

4. The device as claimed in claim 1 wherein the third frequency is either a sum of or a difference between the first and twice the second frequency based on whether the device is used in an upconversion or a downconversion fashion.

5. The device as claimed in claim 1 wherein the second circuit section includes first and second circuits and wherein the first circuit is driven in a quadrature manner relative to the second circuit by the first and second drive signals, and the third and fourth drive signals, respectively.

6. The device as claimed in claim 5 wherein the first circuit includes a first pair of interconnected transistors, the first pair being driven by the first and second drive signals in a differential manner to generate a first current signal switching at twice the second frequency and wherein the second circuit includes a second pair of interconnected transistors which are driven by the third and fourth drive signals in a differential manner to generate a second current signal which has a phase difference of approximately 180° from the first current signal and is also switching at twice the second frequency.

7. The device as claimed in claim 6 wherein the first circuit section is connected to the second circuit section and includes the input port to receive the first signal at the first frequency and the output port to obtain the output signal at the third frequency.

8. The device as claimed in claim 7 wherein double-balanced mixing between the first signal at the first frequency and the first and second current signals at twice the second frequency in the first section generates the output signal at the third frequency which is either a difference between or a sum of the first frequency and twice the second frequency when the device is used as a downconversion or an upconversion mixer, respectively.

9. The device as claimed in claim 1 wherein the second circuit section includes first and second pairs of circuits and wherein the first pair of circuits are driven in a quadrature manner relative to the second pair of circuits by the first and second drive signals and the third and fourth drive signals, respectively.

10. The device as claimed in claim 9 wherein each of the first pair of circuits includes a pair of interconnected transistors which are driven by the first and second drive signals in a differential manner.

11. The device as claimed in claim 10 wherein each of the second pair of circuits includes a pair of interconnected transistors which are driven by the third and fourth drive signals in a differential manner.

12. The device as claimed in claim 11 wherein the first circuit section is connected to the second circuit section and includes the input port which receives the first signal at the first frequency.

13. The device as claimed in claim 12 wherein the first circuit section generates first and second current signals at the first frequency.

14. The device as claimed in claim 13 wherein double-balanced mixing between the first and second current signals at the first frequency and twice the second frequency occurs in the second circuit section due to interconnections of the transistors of the second circuit section and generates the output signal at the third frequency which is either a difference between or a sum of the first frequency and twice the second frequency when the device is used as a down conversion or an up conversion mixer, respectively.

15. A non-linear device for combining a first signal having a first frequency and first, second, third and fourth drive signals each having a second frequency approximately one-half the first frequency to obtain an output signal having a third frequency, the device comprising:

a first circuit section including an input port for receiving the first signal and an output port; and a second circuit section coupled to the first circuit section and having first, second, third and fourth drive ports adapted to receive first, second, third and fourth drive signals, respectively, wherein each of the drive signals is approximately 90° out of phase with respect to two of the other drive signals and approximately 180° out of phase with respect to a third of the other drive signals, and wherein the first drive signal is approximately 90° out of phase with respect to the third drive signal and the second drive signal is approximately 90° out of phase with respect to the fourth drive signal, and wherein at least one circuit of the second circuit section is driven in a quadrature manner relative to at least one other circuit of the second circuit section and visa versa by the drive signals to generate first and second current signals approximately 180° out of phase with respect to each other and each having a frequency approximately twice the second frequency and approximately equal to the first frequency, the first circuit section generating the output signal at the output port based on the first signal and the first and second current signals without any first or second current signal leakage at the output port.

16. The device as claimed in claim 15 wherein the first signal is a radio frequency signal and the first circuit section is an RF section.

17. The device as claimed in claim 15 wherein a first circuit of the second circuit section is driven in a quadrature manner relative to a second circuit of the second circuit section and visa versa by the drive signals.

18. The device as claimed in claim 17 wherein the first circuit of the second circuit section includes a first pair of interconnected transistors which are driven by the first and second drive signals in a differential manner.

19. The device as claimed in claim 18 wherein the second circuit of the second circuit section includes a second pair of interconnected transistors which are driven by the third and fourth drive signals in a differential manner.

20. The device as claimed in claim 15 wherein the third frequency is an intermediate frequency.

21. The device as claimed in claim 15 wherein a first pair of circuits of the second circuit section are driven in a quadrature manner relative to a second pair of circuits of the second circuit section and visa versa by the drive signals.

22. The device as claimed in claim 21 wherein each of the first pair of circuits includes a pair of interconnected transistors which are driven by the first and second drive signals in a differential manner.

23. The device as claimed in claim 22 wherein each of the second pair of circuits includes a pair of interconnected transistors which are driven by the third and fourth drive signals in a differential manner.

* * * * *

UNITED STATES PATENT AND TRADEMARK OFFICE
CERTIFICATE OF CORRECTION

PATENT NO.    : 6,348,830 B1
DATED         : February 19, 2002
INVENTOR(S)   : Gabriel Rebeiz and Kiran Nimmagadda It is certified that error appears in the above-identified patent and that said Letters Patent is hereby corrected as shown below:

<u>Column 9,</u>
Line 45, after "frequency" delete "approxinately" and replace with -- approximately --.

Signed and Sealed this

Eleventh Day of June, 2002

Attest:

Attesting Officer

JAMES E. ROGAN
*Director of the United States Patent and Trademark Office*